(12) United States Patent
Joo

(10) Patent No.: US 9,129,705 B2
(45) Date of Patent: Sep. 8, 2015

(54) SEMICONDUCTOR DEVICES

(71) Applicant: SK hynix Inc., Icheon-si Gyeonggi-do (KR)

(72) Inventor: Yong Suk Joo, Yongin-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/251,222

(22) Filed: Apr. 11, 2014

(65) Prior Publication Data

US 2015/0146492 A1    May 28, 2015

(30) Foreign Application Priority Data

Nov. 25, 2013  (KR) .................. 10-2013-0143405

(51) Int. Cl.
    *G11C 7/00*    (2006.01)
    *G11C 11/4076*    (2006.01)
    *G11C 11/409*    (2006.01)

(52) U.S. Cl.
    CPC .......... *G11C 11/4076* (2013.01); *G11C 11/409* (2013.01)

(58) Field of Classification Search
    CPC .............. G11C 7/1078; G11C 11/406; G11C 11/4076; G11C 2211/4061; G11C 2211/4062; G11C 7/1084; G11C 11/4094; G11C 7/1066; G11C 7/1072; G11C 7/1087; G11C 7/109; G11C 7/1093; G11C 7/22; G11C 11/4082; G11C 11/4093
    USPC ............ 365/189.05, 193, 194, 230.08, 233.1, 365/222, 233.12, 233.16, 233.5
    See application file for complete search history.

(56) References Cited

U.S. PATENT DOCUMENTS

2005/0007836 A1 *  1/2005  Morzano et al. .............. 365/193

FOREIGN PATENT DOCUMENTS

| KR | 1020000045402 A | 7/2000 |
|---|---|---|
| KR | 1020030012558 A | 2/2003 |

* cited by examiner

*Primary Examiner* — Thong Q Le
(74) *Attorney, Agent, or Firm* — William Park & Associates Ltd.

(57) ABSTRACT

The semiconductor device includes an input clock generator and a data input unit. The input clock generator generates an input clock signal including a first pulse and a second pulse, wherein the first pulse is generated in response to a write signal and a write latency signal and the second pulse is generated in response to an external command signal and a burst length signal. The data input unit receives data and generates first input data in response to the first pulse of the input clock signal and receives the data and generates second input data in response of the second pulse of the input clock signal.

20 Claims, 6 Drawing Sheets

SEMICONDUCTOR DEVICES

CROSS-REFERENCE TO RELATED APPLICATION

The present application claims priority under 35 U.S.C. 119(a) to Korean Application No. 10-2013-0143405, filed on Nov. 25, 2013, in the Korean Intellectual Property Office, which is incorporated herein by reference in its entirety as set forth in full.

TECHNICAL FIELD

Embodiments relate to semiconductor devices.

BACKGROUND

In the electronics industry, semiconductor devices with the ability to operate at relatively faster speeds are increasing in demand with the development of higher performance electronic systems.

The development of synchronous dynamic random access memory (SDRAM) devices resulted in improvements in the relative operation speed of the DRAM devices. SDRAM devices typically operate in synchronization with an external clock signal. An example of an operation that may be executed in a SDRAM device is a burst operation. In a burst operation data corresponding to a burst length are successively input in response to a write command signal and successively output in response to a read command signal in accordance with a burst length set by a mode register set (MRS). The burst length of the data for the burst operation may be "4", "8", "16", or "32" bits in length. For example, if the burst length is "16", sixteen bits of data may be successively input in response to a write command signal and successively output in response to a read command signal.

At least two semiconductor devices may communicate with each other via electrical signals. If a specific signal is applied to a first semiconductor device of the at least two semiconductor devices, an operation corresponding to the specific signal may be executed in the first semiconductor device after a predetermined period of time following the receipt of the specific signal at the first semiconductor device. The predetermined time is referred to as latency. For example, a time period extending from the receipt of a read command signal at the first semiconductor device till the output of data from the first semiconductor device in response to the read command signal may be referred to as a column address strobe (CAS) latency, and a time period extending from the receipt of a write command signal at the first semiconductor device till the input of data to the first semiconductor device may be referred to as a write latency period (WL).

SUMMARY

An embodiment of a semiconductor device includes an input clock generator and a data input unit. The input clock generator generates an input clock signal including a first pulse and a second pulse, wherein the first pulse is generated in response to a write signal and a write latency signal and the second pulse is generated in response to an external command signal and a burst length signal. The data input unit receives data and generates first input data in response to the first pulse of the input clock signal and receives the data and generates second input data in response to the second pulse of the input clock signal.

An embodiment of a semiconductor device includes a burst signal generator and an input clock output unit. The burst signal generator generates a first burst signal including a pulse generated in response to a write signal and a write latency signal during a write operation and generates a second burst signal including a pulse generated in response to an external command signal and a burst length signal. The input clock output unit generates an input clock signal, wherein the input clock signal is enabled when the first and second burst signals are generated.

An embodiment of a system includes a memory controller and a semiconductor memory device. The semiconductor memory device includes an input clock generator and a data input unit. The input clock generator generates an input clock signal including a first pulse and a second pulse, wherein the first pulse is generated in response to a write signal and a write latency signal and the second pulse is generated in response to an external command signal and a burst length signal. The data input unit receives data and generates first input data in response to the first pulse of the input clock signal and receives the data and generates second input data in response to the second pulse of the input clock signal.

DETAILED DESCRIPTION OF THE EMBODIMENTS

Various embodiments will be described hereinafter with reference to the accompanying drawings. However, the example embodiments described herein are for illustrative purposes only and are not intended to limit the scope of the inventive concept.

Figure 1:
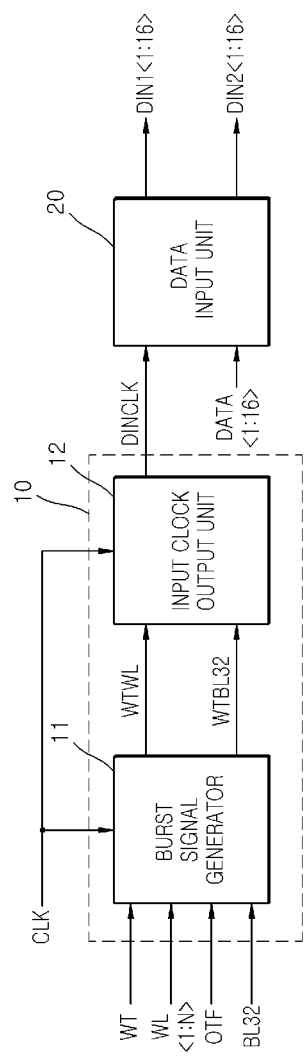
FIG. 1 is a block diagram representation of an embodiment of a semiconductor device.

Referring to FIG. 1, an embodiment of a semiconductor device may include an input clock generator 10 and a data input unit 20.

The input clock generator 10 may include a burst signal generator 11 and an input clock output unit 12. When a write operation is executed, the burst signal generator 11 may receive a write signal WT and responsively generate a first burst signal WTWL. The first burst signal WTWL may include a pulse generated after a write latency period. The write latency period begins approximately when a write signal WT is received at the burst signal generator 11. The burst signal generator 11 may receive an external command signal OTF and responsively generate a second burst signal WTBL 32. The second burst signal WTBL 32 may include a pulse generated after a burst length period elapses following the generation of the first burst signal WTWL. The input clock output unit 12 may generate an input clock signal DINCLK. The input clock signal DINCLK may include a first pulse generated when a pulse of the first burst signal WTWL is received at the input clock unit 12 and a second pulse generated when a pulse of the second burst signal WTBL 32 is received at the input clock unit 12. The write latency period and the burst length period will be described in further detail below.

The data input unit 20 may receive data DATA<1:16> as an input and generate first input data DIN1<1:16> when the first pulse of the input clock signal DINCLK is received at the data input unit 20. The data input unit 20 may receive the data DATA<1:16> and generate second input data DIN2<1:16> when the second pulse of the input clock signal DINCLK is received at the data input unit 20.

Figure 2:
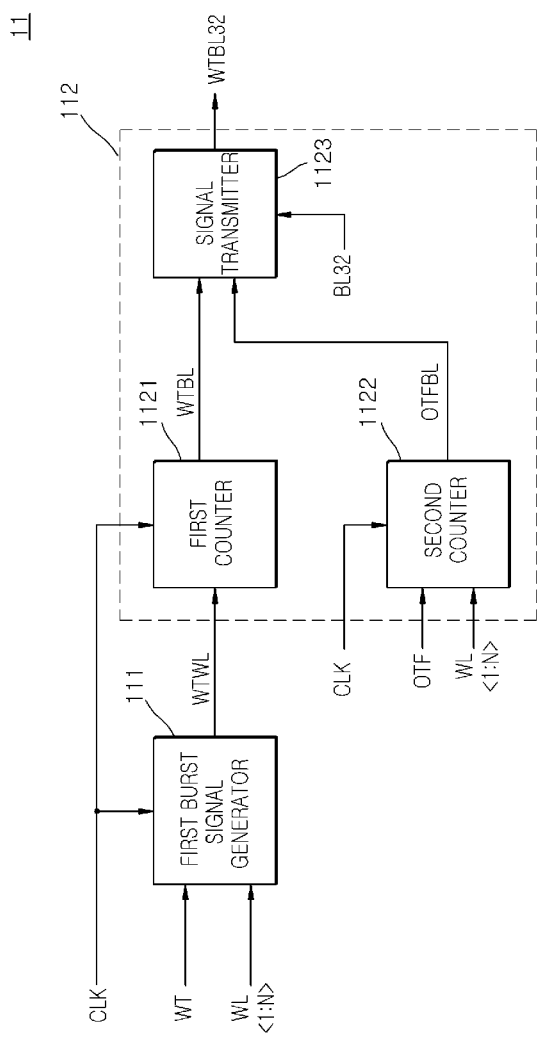
FIG. 2 is a block diagram representation of the burst signal generator of the semiconductor device of FIG. 1.

Referring to FIG. 2, the burst signal generator 11 may include a first burst signal generator 111 and a second burst signal generator 112.

The first burst signal generator 111 may generate the first burst signal WTWL including a pulse generated when a pulse of an external clock signal CLK is received at the first burst signal generator 111 a first predetermined number of times following the receipt of the write signal WT. A time period extending from approximately when the write signal WT is received at the first burst signal generator 111 and when a pulse of the external clock signal CLK is received at the first burst signal generator 111 the first predetermined number of times may be defined as a write latency period WL. The write latency period WL may be set according to a logic combination of write latency signals WL<1:N>.

The second burst signal generator 112 may include a first counter 1121, a second counter 1122 and a signal transmitter 1123. The first counter 1121 may generate a first internal burst signal WTBL. The first internal burst signal WTBL may include a pulse generated when a pulse of the external clock signal CLK is received at the first counter 1121 a second predetermined number of times after the first burst signal WTWL is received at the first counter 1121. In an embodiment, the first counter 1121 may be configured such that the first internal burst signal WTBL is not generated when a burst length is set to be "16". When the external command signal OTF is received at the second counter 1122, the second counter 1122 may responsively generate a second internal burst signal OTFBL. The second internal burst signal may include a pulse generated when a pulse of the external clock signal CLK is received at the second counter 1122 the second predetermined number of times after the write latency period WL. The write latency period may be determined by the termination of the write latency signals WL<1:N>. The signal transmitter 1123 may output one of the first and second internal burst signals WTBL, OTFBL as the second burst signal WTBL32 based on a level of a burst length signal BL32. The burst length signal BL32 may be a signal that is supplied by an external device to set the burst length.

Figure 3:
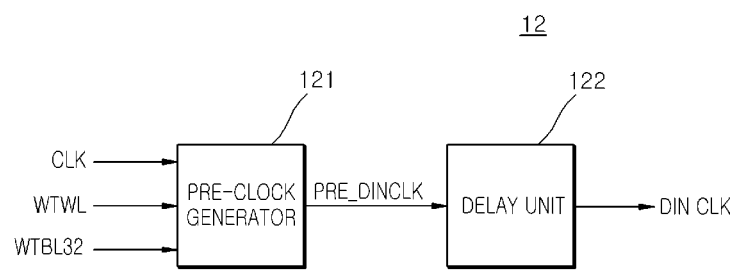
FIG. 3 is a block diagram representation of the input clock output unit of the the semiconductor device of FIG. 1.

Referring to FIG. 3, the input clock output unit 12 may include a pre-clock generator 121 and a delay unit 122.

The pre-clock generator 121 may generate a pre-clock signal PRE_DINCLK. The pre-clock signal may include a pulse generated in synchronization with the external clock signal CLK when the first burst signal WTWL or the second burst signal WTBL32 is received at the pre-clock generator 121.

The delay unit 122 may delay the pre-clock signal PRE_DINCLK by a predetermined period of time to generate the input clock signal DINCLK.

Figure 4:
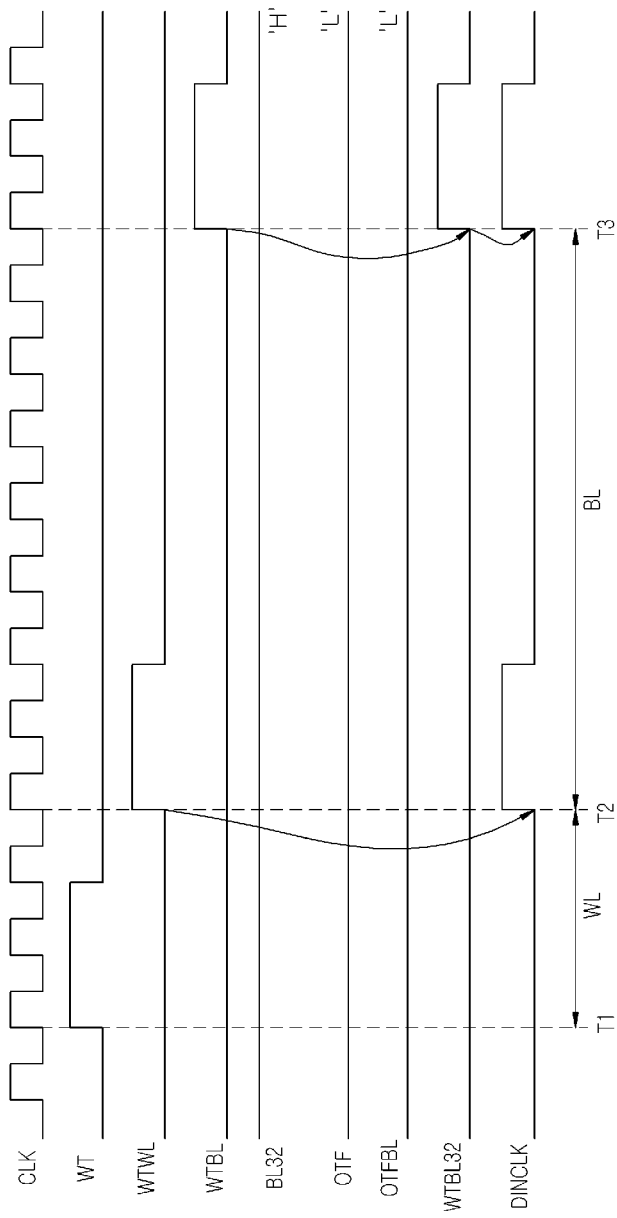
FIGS. 4 and 5 are timing diagrams illustrating operations of an embodiment of a semiconductor device.

An operation of a semiconductor device having the aforementioned configuration will be described hereinafter with reference to FIG. 4 in conjunction with an example in which the burst length is set to be "32" and the external command signal OTF is not received at the semiconductor device during a write operation. It may be assumed that the write latency period WL is set to be three cycle times of the external clock signal CLK (the three cycles corresponding to the first predetermined number of times) and the burst length period BL is set to be eight cycle times of the external clock signal CLK (the eight cycles corresponding to the second predetermined number of times).

At a time "T1", the semiconductor device may execute a write operation in response to receiving a write signal WT having a logic "high" level.

At a time "T2", the first burst signal generator 111 may receive the write signal WT to generate the first burst signal WTWL having a logic "high" level because the time "T2" corresponds to when a pulse of the external clock signal CLK is received at the first burst signal generator 111 the first predetermined number of times (i.e., three times) after the time "T1". A time period extending from approximately the time "T1" to approximately the time "T2" may correspond to the write latency period WL. The write latency period WL is set according to a logic combination of the write latency signals WL<1:N>. The pre-clock generator 121 may generate the first burst signal WTWL as the pre-clock signal PRE_DINCLK in synchronization with the external clock signal CLK. The delay unit 122 may delay the pre-clock signal PRE_DINCLK by a predetermined period of time to generate a first pulse of the input clock signal DINCLK.

The data input unit 20 may receive the data DATA<1:16> and generate the first input data DIN1<1:16> in response to receiving the first pulse of the input clock signal DINCLK. The number of bits of the data DATA<1:16> may be set to be "16".

At a time "T3", the first counter 1121 of the second burst signal generator 112 may receive the first burst signal WTWL and generate the first internal burst signal WTBL having a logic "high" level because the time "T3" corresponds to a pulse of the external clock signal CLK being received at the first counter 1121 the second predetermined number of times (i.e., eight times) after the time "T2". A time period extending from approximately the time "T2" to approximately the time "T3" may correspond to the burst length period BL. In such a case, the second counter 1122 does not generate any pulse of the second internal burst signal OTFBL because no external command signal OTF is received at the second counter 1122. The signal transmitter 1123 may receive the burst length signal BL32 having a logic "high" level to generate the first internal burst signal WTBL as the second burst signal WTBL32. The burst length signal BL32 may have a logic "high" level if the burst length is set to be "32". The pre-clock generator 121 may generate the second burst signal WTBL32 as the pre-clock signal PRE_DINCLK in synchronization with the external clock signal CLK. The delay unit 122 may delay the pre-clock signal PRE_DINCLK by a predetermined period of time to generate a second pulse of the input clock signal DINCLK.

The data input unit 20 may receive the data DATA<1:16> and generate the second input data DIN2<1:16> in response to the second pulse of the input clock signal DINCLK. The number of bits of the data DATA<1:16> may be set to be "16".

As described above, the semiconductor device may generate the first and second input data DIN1<1:16>, DIN2<1:16> having 32 bits in response to the first and second pulses of the input clock signal DINCLK when the burst length is set to be "32" and no external command signal OTF is received at the semiconductor device.

Figure 5:
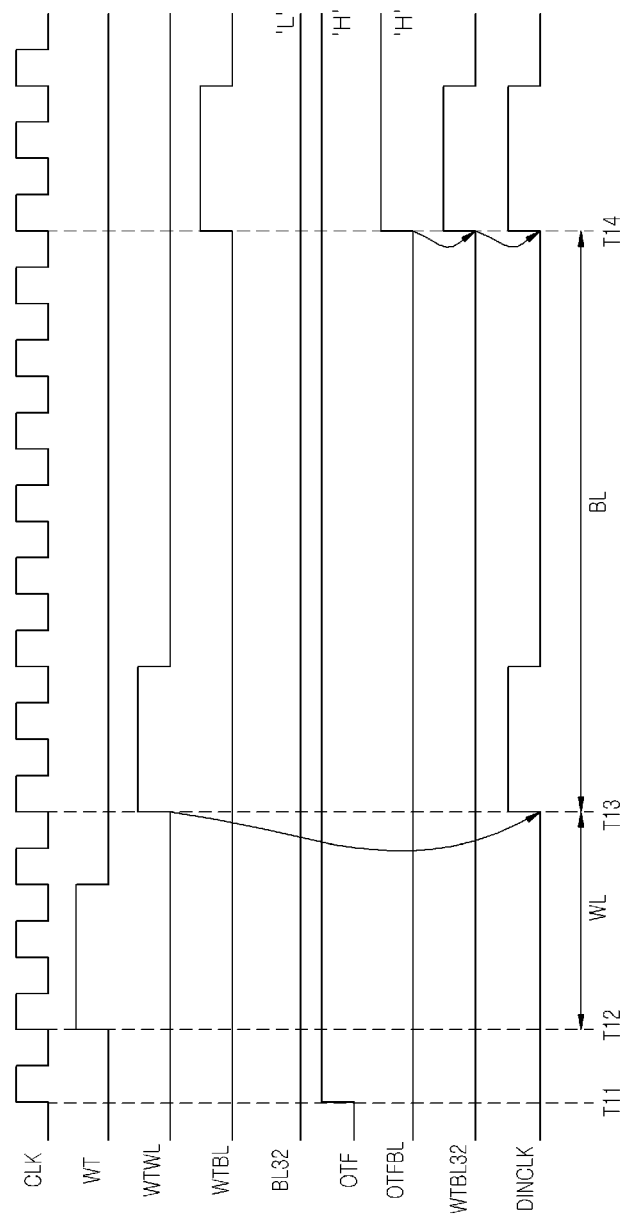

An operation of the semiconductor device having the aforementioned configuration will be described hereinafter with reference to FIG. 5 in conjunction with an example in which the burst length is set to be "16" and the external command signal OTF is received at the semiconductor device during a write operation. It may be assumed that the write latency period WL is set to be three cycle times of the external clock signal CLK (the three cycles corresponding to the first predetermined number of times) and the burst length period BL is set to be eight cycle times of the external clock signal CLK (the eight cycles corresponding to the second predetermined number of times).

FAt a time "T11", the external command signal OTF having a logic "high" level may be received at the semiconductor device.

At a time "T12", the semiconductor device may execute a write operation in response to receiving a write signal WT having a logic "high" level.

At a time "T13", the first burst signal generator 111 may receive the write signal WT and generate the first burst signal WTWL having a logic "high" level because the time "T13" corresponds to when a pulse of the external clock signal CLK is received at the first burst signal generator 111 the first predetermined number of times (i.e., three times) after the time "T12". A time period extending from approximately the time "T12" and approximately the time "T13" may correspond to the write latency period WL. The write latency period WL may be set according to a logic combination of the write latency signals WL<1:N>. The pre-clock generator 121 may generate the first burst signal WTWL as the pre-clock signal PRE_DINCLK in synchronization with the external clock signal CLK. The delay unit 122 may delay the pre-clock signal PRE_DINCLK by a predetermined period to generate a first pulse of the input clock signal DINCLK.

The data input unit 20 may receive the data DATA<1:16> to generate the first input data DIN1<1:16> in response to receiving the first pulse of the input clock signal DINCLK. The number of bits of the data DATA<1:16> may be set to be "16".

At a time "T14", the first counter 1121 of the second burst signal generator 112 may receive the first burst signal WTWL and generate the first internal burst signal WTBL having a logic "high" level because the time "T14" corresponds to when a pulse of the external clock signal CLK is received at the first counter 1121 the second predetermined number of times (i.e., eight times) after the time "T13". A time period extending from approximately the time "T13" to approximately the time "T14" may correspond to the burst length period BL. The first counter 1121 may be configured such that the first internal burst signal WTBL is not generated when the burst length is set to be "16". In such a case, the second counter 1122 may receive the external command signal OTF having a logic "high" level to generate the second internal burst signal OTFBL having a logic "high" level. The signal transmitter 1123 may receive the burst length signal BL32 having a logic "low" level and generate the second internal burst signal OTFBL as the second burst signal WTBL32. The burst length signal BL32 may have a logic "low" level when the burst length is set to be "16". The pre-clock generator 121 may generate the second burst signal WTBL32 as the pre-clock signal PRE_DINCLK in synchronization with the external clock signal CLK. The delay unit 122 may delay the pre-clock signal PRE_DINCLK by a predetermined period of time to generate a second pulse of the input clock signal DINCLK.

The data input unit 20 may receive the data DATA<1:16> to generate the second input data DIN2<1:16> in response to receiving the second pulse of the input clock signal DINCLK. The number of bits of the data DATA<1:16> may be set to be "16".

As described above, when the burst length is set to be "16" and the external command signal OTF is received at the semiconductor device, the burst length may be controlled to have "32". The semiconductor device may generate the first and second input data DIN1<1:16>, DIN2<1:16> having 32 bits in response to the first and second pulses of the input clock signal DINCLK, respectively.

According to the various embodiments, the semiconductor device may control the burst length according to the external command signal during the burst operation in a write mode.

Figure 6:
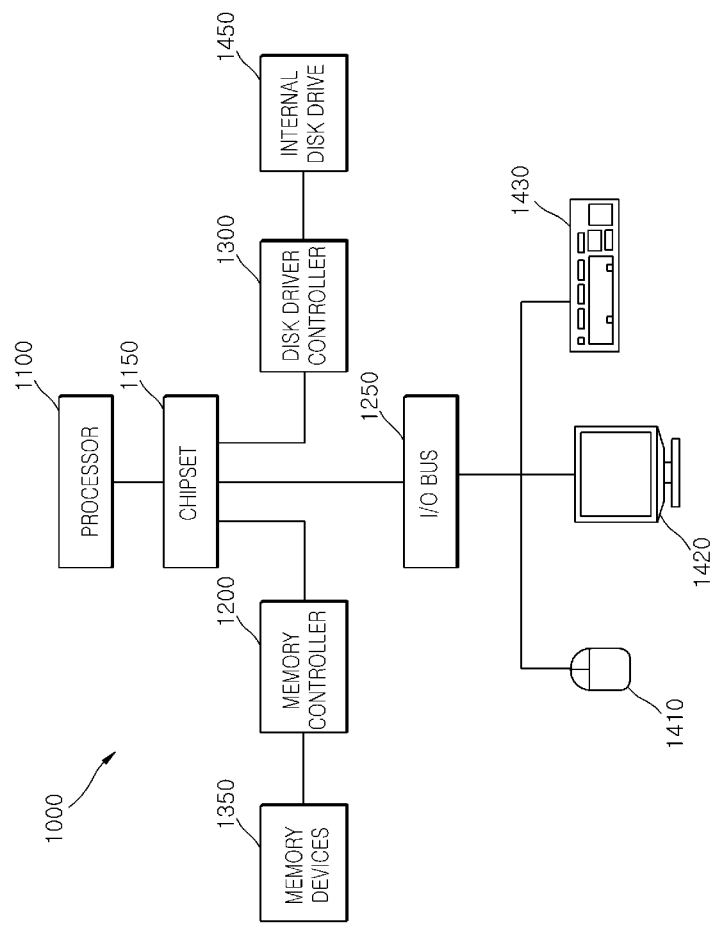
FIG. 6 is block diagram representation of a system including an embodiment of a semiconductor device.

Referring to FIG. 6, a block diagram representation of a system 1000 including an embodiment of a semiconductor device 1350 is shown. In an embodiment, the semiconductor device 1350 is the semiconductor device of FIG. 1. In an embodiment, the semiconductor device 1350 is a semiconductor memory device. The system 1000 includes one or more semiconductor memory devices 1350 and a memory controller 1200

Examples of the semiconductor memory device 1350 include, but are not limited to, dynamic random access memory, static random access memory, synchronous dynamic random access memory (SDRAM), synchronous graphics random access memory (SGRAM), double data rate dynamic ram (DDR), and double data rate SDRAM.

The memory controller 1200 is used in the design of memory devices, processors, and computer systems. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented A chipset 1150 may be electrically coupled to the CPU 1100. The chipset 1150 is a communication pathway for signals between the CPU 1100 and other components of the system 1000, which may include the memory controller 1200, an input/output ("I/O") bus 1250, and a disk drive controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be electrically coupled to the chipset 1150. The memory controller 1200 can receive a request provided from the CPU 1100, through the chipset 1150. In alternate embodiments, the memory controller 1200 may be integrated into the chipset 1150. The memory controller 1200 may be electrically coupled to one or more memory devices 1350. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may be electrically coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1300 may also be electrically coupled to the chipset 1150. The disk drive controller 1300 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

The system 1000 described above in relation to FIG. 6 is merely one example of a system employing a semiconductor memory device 1350. In alternate embodiments, such as cellular phones or digital cameras, the components may differ from the embodiment shown in FIG. 6.

While certain embodiments have been described above, it will be understood to those skilled in the art that the embodiments described are by way of example only. Accordingly, the semiconductor device described herein should not be limited based on the described embodiments. Rather, the semiconductor device described herein should only be limited in light of the claims that follow when taken in conjunction with the above description and accompanying drawings.

What is claimed is:

1. A semiconductor device comprising:
   an input clock generator suitable for generating an input clock signal including a first pulse and a second pulse, wherein the first pulse is generated in response to a write signal and a write latency signal and the second pulse is generated in response to an external command signal and a burst length signal; and
   a data input unit suitable for receiving data and generating first input data in response to the first pulse of the input clock signal and suitable for receiving the data and generating second input data in response to the second pulse of the input clock signal,
   wherein the write latency signal is for setting a write latency period and the burst length signal is for setting a burst length period, and
   wherein the write latency period is a time period from when the write signal is received to when input the data and the burst length period is a time period successively input the data.

2. The semiconductor device of claim 1, wherein the first pulse of the input clock signal is generated after a write latency period elapses following the receipt of the write signal at the input clock generator.

3. The semiconductor device of claim 1, wherein the second pulse of the input clock signal is generated after a burst length period elapses following the generation of the input clock signal.

4. The semiconductor device of claim 1, wherein the input clock generator comprises:
   a burst signal generator suitable for generating a first burst signal including a pulse generated in response to the write signal and the write latency signal and suitable for generating a second burst signal including a pulse generated in response to the external command signal and the burst length signal; and
   an input clock output unit suitable for generating the input clock signal, wherein the input clock signal is enabled at times when the first and second burst signals are generated.

5. The semiconductor device of claim 4, wherein the burst signal generator comprises:
   a first burst signal generator suitable for generating the first burst signal including a pulse generated in response to the write signal and the write latency signal following a write latency period; and
   a second burst signal generator suitable for generating the second burst signal including a pulse generated in response to one of the external command signal and the first burst signal following a burst length period.

6. The semiconductor device of claim 5, wherein the write latency period corresponds to a time period extending from approximately when the write signal is received at the first burst signal generator till approximately a when a pulse of an external clock signal is received at the first burst signal generator a first predetermined number of times.

7. The semiconductor device of claim 5, wherein the burst length period corresponds to a time period extending from approximately when the first burst signal is generated till approximately when a pulse of an external clock signal is received at the second signal generator a second predetermined number of times.

8. The semiconductor device of claim 5, wherein the second burst signal generator comprises:
   a first counter suitable for generating a first internal burst signal including a pulse generated when a pulse of an external clock signal is received at the first counter a second predetermined number of times and in response to the first burst signal;
   a second counter suitable for receiving the external command signal and the write latency signal and generating a second internal burst signal including a pulse generated when a pulse of the external clock signal is received at the second counter the second predetermined number of times after the first burst signal is generated; and
   a signal transmitter suitable for generating one of the first and second internal burst signals as the second burst signal based on a level of the burst length signal.

9. The semiconductor device of claim 4, wherein the input clock output unit comprises:
   a pre-clock generator suitable for generating a pre-clock signal including a pulse generated in response to an external clock signal when one of the first burst signal and the second burst signal is received at the pre-clock generator; and
   a delay unit suitable for delaying the pre-clock signal by a predetermined period of time to generate the input clock signal.

10. A semiconductor device comprising:
    a burst signal generator suitable for generating a first burst signal including a pulse generated in response to a write signal and a write latency signal during a write operation and suitable for generating a second burst signal including a pulse generated in response to an external command signal and a burst length signal; and
    an input clock output unit suitable for generating an input clock signal, wherein the input clock signal is enabled when the first and second burst signals are generated,
    wherein the write latency signal is for setting a write latency period and the burst length signal is for setting a burst length period, and
    wherein the write latency period is a time period from when the write signal is received to when input the data and the burst length period is a time period successively input the data.

11. The semiconductor device of claim 10, wherein the pulse of the first burst signal is generated after a write latency period elapses following the receipt of the write signal at the burst signal generator.

12. The semiconductor device of claim 10, wherein the pulse of the second burst signal is generated after a burst length period elapses following the generation of the first burst signal.

13. The semiconductor device of claim 10, wherein the burst signal generator comprises:
   a first burst signal generator suitable for generating the first burst signal including the pulse, wherein the pulse is generated after a write latency period and in response to the write signal and the write latency signal; and
   a second burst signal generator suitable for generating the second burst signal including the pulse, wherein the pulse is generated after a burst length period and in response to one of the external command signal and the first burst signal.

14. The semiconductor device of claim 13, wherein the write latency period corresponds to a time period extending from approximately when the write signal is received at the first burst signal generator till approximately when a pulse of an external clock signal received at the first burst signal generator a first predetermined number of times.

15. The semiconductor device of claim 13, wherein the burst length period corresponds to a time period extending from approximately when the first burst signal is generated till approximately when a pulse of an external clock signal is received at the second signal generator a second predetermined number of times.

16. The semiconductor device of claim 13, wherein the second burst signal generator comprises:
   a first counter suitable for generating a first internal burst signal including a pulse generated when a pulse of an external clock signal is received at the first counter a second predetermined number of times and in response to the first burst signal;
   a second counter suitable for receiving the external command signal and the write latency signal and generating a second internal burst signal including a pulse generated when a pulse of the external clock signal is received at the second counter the second predetermined number of times following the generation of the first burst signal; and
   a signal transmitter suitable for generating one of the first and second internal burst signals as the second burst signal based on a level of the burst length signal.

17. The semiconductor device of claim 10, wherein the input clock output unit comprises:
   a pre-clock generator suitable for generating a pre-clock signal including a pulse generated in response to an external clock signal when one of the first burst signal and the second burst signal is received at the pre-clock generator; and
   a delay unit suitable for delaying the pre-clock signal by a predetermined period of time to generate the input clock signal.

18. The semiconductor device of claim 10, further comprising a data input unit suitable for receiving data and generating first input data in response to a first pulse of the input clock signal and suitable for receiving the data and generating second input data in response to a second pulse of the input clock signal.

19. A system comprising:
   a memory controller; and
   a semiconductor memory device comprising:
      an input clock generator suitable for generating an input clock signal including a first pulse and a second pulse, wherein the first pulse is generated in response to a write signal and a write latency signal and the second pulse is generated in response to an external command signal and a burst length signal; and
      a data input unit suitable for receiving data and generating first input data in response to the first pulse of the input clock signal and suitable for receiving the data and generating second input data in response to the second pulse of the input clock signal,
   wherein the write latency signal is for setting a write latency period and the burst length signal is for setting a burst length period, and
   wherein the write latency period is a time period from when the write signal is received to when input the data and the burst length period is a time period successively input the data.

20. The semiconductor device of claim 1, wherein the semiconductor device is a semiconductor memory device.

* * * * *